United States Patent
Perebeinos et al.

(10) Patent No.: US 12,329,042 B1
(45) Date of Patent: Jun. 10, 2025

(54) QUANTUM DEVICES AND METHODS USING ENTANGLED PHOTONS AND PHONONS

(71) Applicant: The Research Foundation for The State University of New York, Amherst, NY (US)

(72) Inventors: Vasili Perebeinos, Amherst, NY (US); Jonathan P. Bird, Buffalo, NY (US); Huamin Li, Williamsville, NY (US)

(73) Assignee: The Research Foundation for The State University of New York, Amherst, NY (US)

( * ) Notice: Subject to any disclaimer, the term of this patent is extended or adjusted under 35 U.S.C. 154(b) by 293 days.

(21) Appl. No.: 17/585,528

(22) Filed: Jan. 26, 2022

Related U.S. Application Data

(60) Provisional application No. 63/141,840, filed on Jan. 26, 2021.

(51) Int. Cl.
| | |
|---|---|
| *H10N 60/10* | (2023.01) |
| *G06N 10/40* | (2022.01) |
| *H01P 3/00* | (2006.01) |
| *H10N 60/85* | (2023.01) |

(52) U.S. Cl.
CPC ............ *H10N 60/11* (2023.02); *G06N 10/40* (2022.01); *H01P 3/003* (2013.01); *H10N 60/128* (2023.02); *H10N 60/855* (2023.02)

(58) Field of Classification Search
CPC .... H10N 60/11; H10N 60/128; H10N 60/855; G06N 10/40; H01P 3/003
See application file for complete search history.

(56) References Cited

U.S. PATENT DOCUMENTS

| | | | |
|---|---|---|---|
| 3,693,104 A | * 9/1972 | Silvera | H01S 4/00 330/53 |
| 8,600,200 B1 | 12/2013 | Rakich et al. | |
| 9,268,092 B1 | 2/2016 | Jarecki, Jr. et al. | |
| 9,696,492 B1 | 7/2017 | Cox et al. | |
| 9,713,650 B2 | * 7/2017 | Sitharaman | A61K 49/10 |
| 10,025,123 B1 | 7/2018 | Rakich et al. | |
| 10,193,067 B2 | * 1/2019 | Scheibner | H01L 29/127 |
| 10,610,607 B2 | * 4/2020 | Sitharaman | A61K 49/10 |
| 11,522,117 B2 | * 12/2022 | Englund | G06N 10/00 |

(Continued)

OTHER PUBLICATIONS

Mirhosseini, M., et al., Superconducting qubit to optical photon transduction, Nature, Dec. 23, 2020, vol. 588, pp. 599-603.

(Continued)

*Primary Examiner* — David A Vanore
(74) *Attorney, Agent, or Firm* — Hodgson Russ LLP

(57) ABSTRACT

The present disclosure describes electron-photon and electron-phonon interactions in 2D material systems. In some embodiments, novel entangled states are implemented. Such entangled states may involve the superposition of electronic and phononic modes in these materials. The states may be utilized to realize the transduction of quantum information and sensing. In an aspect, the present disclosure may be a quantum sensor having a single-phonon emitter configured to emit a single phonon. A phononic transducer is configured to receive the emitted single phonon from the single-phonon emitter and propagate the single phonon. A phonon detector is configured to detect an arrival of the propagated single phonon received from the phononic transducer.

23 Claims, 6 Drawing Sheets

(56) References Cited

U.S. PATENT DOCUMENTS

| | | | | |
|---|---|---|---|---|
| 2009/0066948 A1* | 3/2009 | Karpowicz | ............... | G01J 3/42 |
| | | | | 356/326 |
| 2015/0280124 A1* | 10/2015 | Tahan | ................... | H10N 99/05 |
| | | | | 250/493.1 |
| 2017/0317282 A1* | 11/2017 | Scheibner | ............... | H01L 29/16 |
| 2020/0062583 A1 | 2/2020 | Painter et al. | | |
| 2020/0309595 A1 | 10/2020 | Lukin et al. | | |
| 2021/0117845 A1* | 4/2021 | Choi | ...................... | G06N 10/00 |
| 2021/0296558 A1* | 9/2021 | Englund | ................ | H10N 39/00 |
| 2021/0328685 A1* | 10/2021 | Wang | ..................... | H04B 10/70 |

OTHER PUBLICATIONS

Jiang, W., et al., Efficient bidirectional piezo-optomechanical transduction between microwave and optical frequency, Nature Communications, Mar. 3, 2020, vol. 11, No. 1166, 7 pages.

Vainsencher, A., et al., Bi-directional conversion between microwave and optical frequencies in a piezoelectric optomechanical device, Applied Physics Letters, Apr. 20, 2016, vol. 109, No. pp. 033107-1-033107-4.

Chu, Y., et al., Quantum acoustics with superconducting qubits, Science, Sep. 21, 2017, vol. 358, No. 6360, pp. 1999-202.

Kervinen, M., et al., Interfacing planar superconducting qubits with high overtone bulk acoustic phonons, Physical Review B, May 29, 2018, vol. pp. 205443-1-205443-6.

Peairs, G.A., et al., Continuous and Time-Domain Coherent Signal Conversion between Optical and Microwave Frequencies, Physical Review Applied, Dec. 4, 2020, vol. 14, pp. 061001-1-061001-6.

Shin, H., et al., Control of coherent information via on-chip photonic-phononic emitter-receivers, Nature Communications, Mar. 5, 2015, vol. 6, No. 6427, 8 pages.

Grosso, G., et al., Low-temperature electron-phonon interaction of quantum emitters in hexagonal Boron Nitride, ACS Photonics, May 8, 2020, vol. 7, No. 6, 18 pages.

* cited by examiner

QUANTUM DEVICES AND METHODS USING ENTANGLED PHOTONS AND PHONONS

CROSS-REFERENCE TO RELATED APPLICATIONS

This application claims priority to U.S. Provisional Application No. 63/141,840, filed on Jan. 26, 2021, now pending, the disclosure of which is incorporated herein by reference.

FIELD OF THE DISCLOSURE

The present disclosure relates to quantum devices for use in quantum sensors, quantum frequency converters, and/or other quantum applications.

BACKGROUND OF THE DISCLOSURE

An important goal of quantum technology is to generate, propagate, and detect quantum states, and to entangle them in nonclassical superpositions. Photons are paradigms of quantum states, whose entanglement is essential for quantum cryptography and for optical quantum computing. Entanglement of single phonons has recently been demonstrated in two-dimensional (2D) transition-metal dichalcogenides (TMDs or TMDCs), a discovery with the potential to open up new approaches to the transduction of quantum information.

BRIEF SUMMARY OF THE DISCLOSURE

The present disclosure describes electron-photon and electron-phonon interactions in 2D material systems. In some embodiments, novel entangled states are implemented. Such entangled states may involve the superposition of electronic and phononic modes in these materials. The states may be utilized to realize the transduction of quantum information and sensing. We also discuss mechanisms for decoherence of quantum information, exploiting the large energies and weak scattering associated with the electronic and phononic states in 2D materials to realize quantum coherence at elevated temperatures. Designs for phonon engineering, analogous to those developed for photonic crystals, are also described.

The present disclosure provides approaches to the physical representation of quantum information, using the natural elemental quanta that arise in the solid-state. We furthermore disclose novel entangled states, involving the superposition of electronic, photonic, and phononic modes in 2D materials, and to utilize these states to realize the transduction of quantum information over long on-chip distances (see, for example, FIGS. 2(a) and 2(b)). We also explore mechanisms for decoherence of quantum information, exploiting the large energies and weak scattering associated with the electronic and phononic states in 2D materials to realize quantum coherence at optimized temperatures.

DESCRIPTION OF THE DRAWINGS

For a fuller understanding of the nature and objects of the disclosure, reference should be made to the following detailed description taken in conjunction with the accompanying drawings.

DETAILED DESCRIPTION OF THE DISCLOSURE

An important goal of quantum technology is to generate, propagate, and detect quantum states, and to entangle them in nonclassical superpositions. To achieve these tasks in a scalable scheme, it may be desirable to implement them with all-electrical control, in a solid-state environment. Among the excitations that may be used to convey quantum information, charge (electrons, holes, and excitons), photons, and phonons are the most ubiquitous (forming the so-called quantum triad depicted in FIG. 1). Photons are paradigms of quantum states, whose entanglement is essential for quantum cryptography and for optical quantum computing. Entanglement of single phonons has recently been demonstrated in two-dimensional (2D) transition-metal dichalcogenides (TMDs or TMDCs), a discovery with the potential to open up approaches to the transduction of quantum information. Finally, single charges (electrons or holes) may be driven on-demand in nanoscale devices, allowing specific photonic (excitonic) or phononic modes to be excited, by exploiting the many-body interactions (light-matter coupling; electron-phonon coupling) that arise in crystalline materials.

Figure 1:
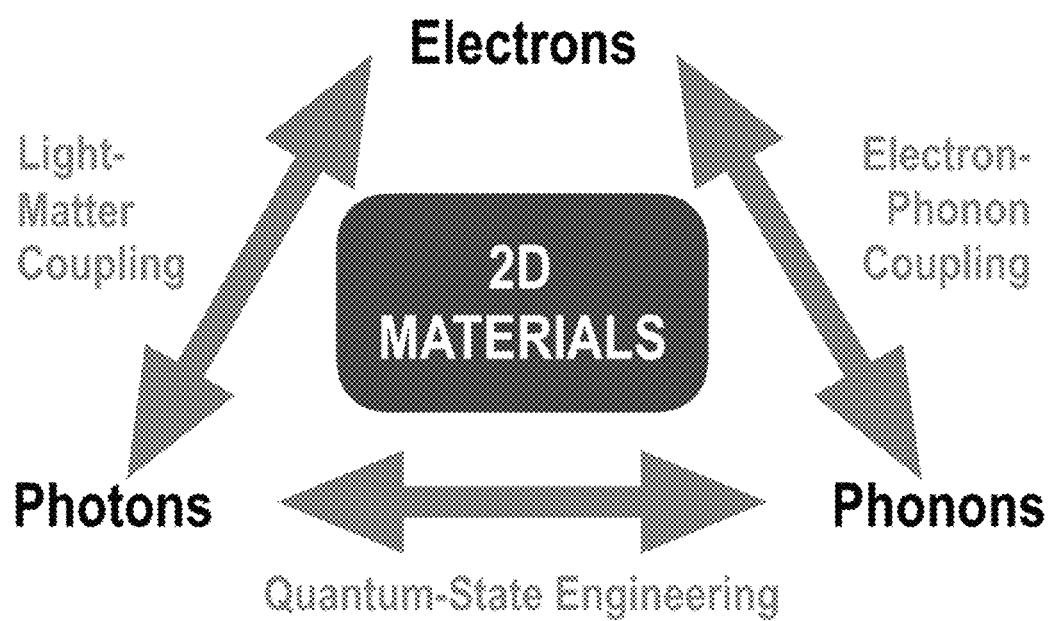
FIG. 1. The "quantum triad," involving control and interchange of single electrons, photons, and phonons. The present disclosure focuses primarily on electron-photon and electron-phonon manipulation.

Aspects of the present disclosure are driven by the recognition that the implementation of scalable quantum technologies may require the capacity to manipulate the quantum triad of FIG. 1, moving interchangeably between its various degrees of freedom. Making recognition is all the more demanding because the interactions that arise among these quanta are often viewed as uncontrollable sources of decoherence. At the same time, however, it is also understood that suitable design of the environment may be used to enhance coherent coupling between different quantum systems. Motivated by these considerations, an aspect of the present disclosure is the development of on-demand, all-electrical approaches to the manipulation of elementary quanta in the solid-state. To achieve this, atomically-thin van der Waals materials are used as the physical platform for our approach. This line of approach is driven by the outstanding physical (electronic, optical and thermal) properties of these two-dimensional (2D) materials, which can be conveniently implemented in heterostructured form and which are amenable to integration with existing silicon technology. Additionally, the strong two-dimensional confinement in these materials means that their characteristic (electronic, phononic, and excitonic) energy scales can be very much higher than those of traditional, bulk semiconductors. Dependent upon the application, this suggests the promise of operation at increased temperatures, for example, compared to the temperatures usually required by bulk materials (for example, Si and GaAs) for quantum-coherent operation.

Entanglement of single phonons has recently been demonstrated in two-dimensional (2D) TMDs, in a discovery that has the potential to open up new approaches to the long-range transduction of quantum information. Finally, single electrons (or holes) may be driven on-demand in nanoscale devices, allowing specific photonic (excitonic) or phononic modes to be excited, by exploiting the many-body interactions (light-matter coupling vs. electron-phonon interaction) that arise in crystalline materials.

Techniques for the all-electrical sourcing and detection of single phonons are described. Such techniques may be utilized to transduce quantum information between disparate locations on-chip. The robust phonon coherence of 2D materials makes them advantageous for such use.

Figure 2:
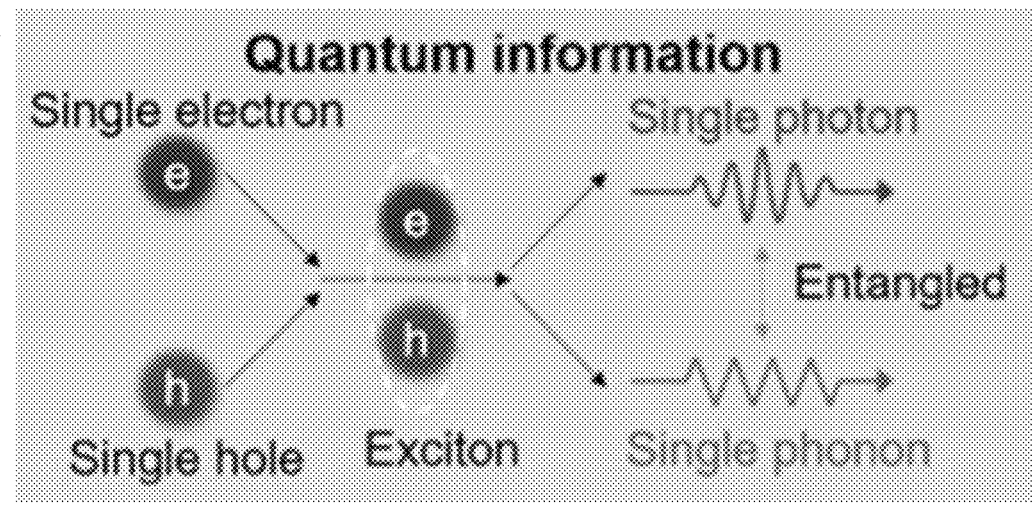
FIG. 2. (a) Schematic representation of the present disclosure of quantum information involving the superposition of electronic, photonic, and phononic modes. (b) An exemplary integrated quantum device for electrically-generated entanglement of a phonon-photon pair according to an embodiment of the present disclosure.
Figure 2:
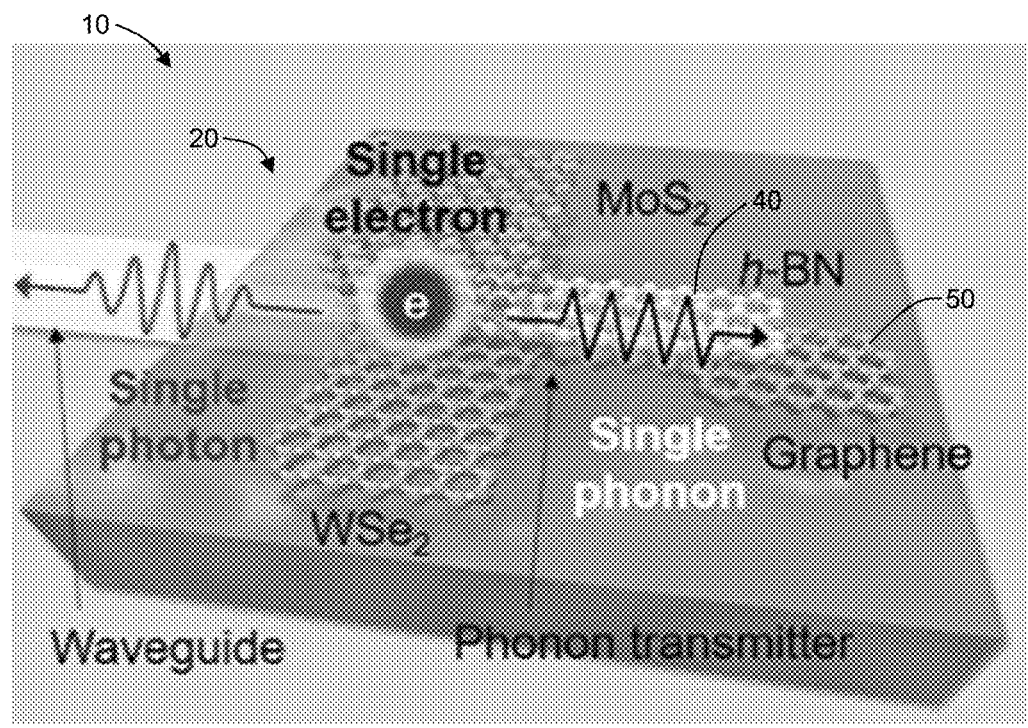

With reference to FIG. 2(b), in an aspect, the present disclosure may be embodied as a quantum sensor 10. The quantum sensor includes a single-phonon emitter 20 configured to emit a single phonon. A phononic transducer 40 is configured to receive the emitted single phonon from the single-phonon emitter 20 and propagate the single phonon. A phonon detector 50 is configured to detect an arrival of the propagated single phonon received from the phononic transducer 40.

In some embodiments, the single-phonon emitter 20 has a single-electron emitter 30 configured to emit a single electron, which spontaneously emits a single phonon. In some embodiments, the single-phonon emitter 20 has a single-hole emitter 26 configured to emit a single hole, which spontaneously emits a single phonon.

Figure 5:
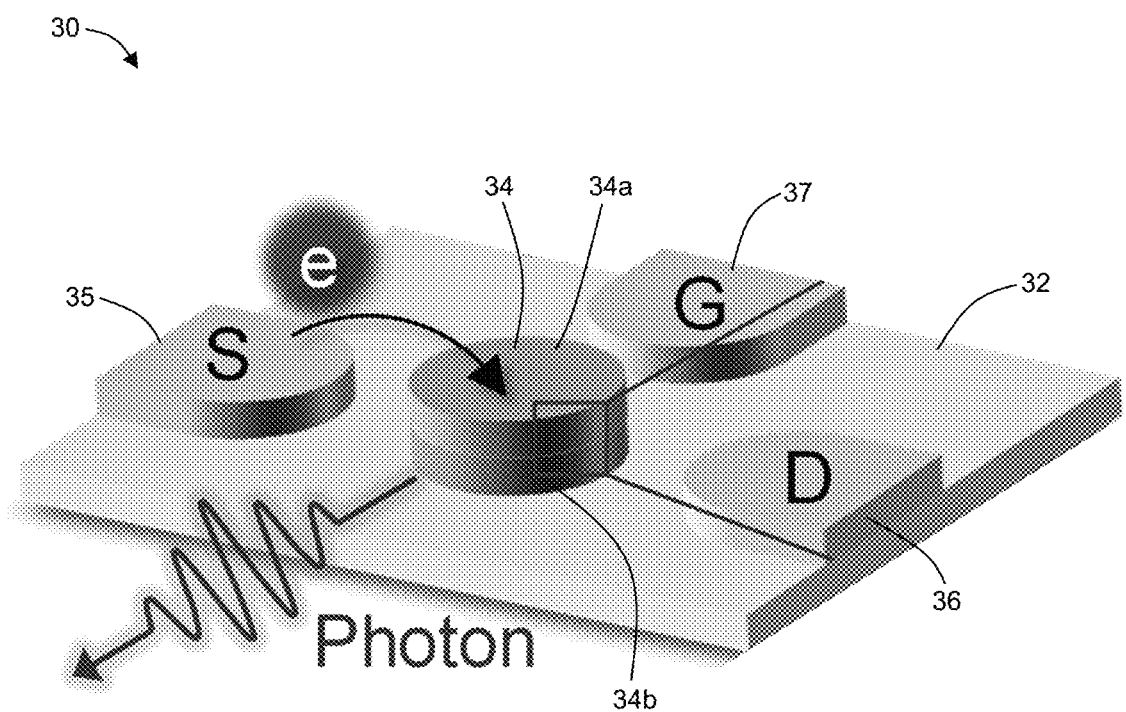
FIG. 5. An single-photon emitter according to an embodiment of the present disclosure. A schematic illustration of a 2D $MoS_2/WSe_2$ heterostructured device in which a quantum island is used to realized single-photon emission under the combined action of single-electron and single-hole transport.
Figure 6:
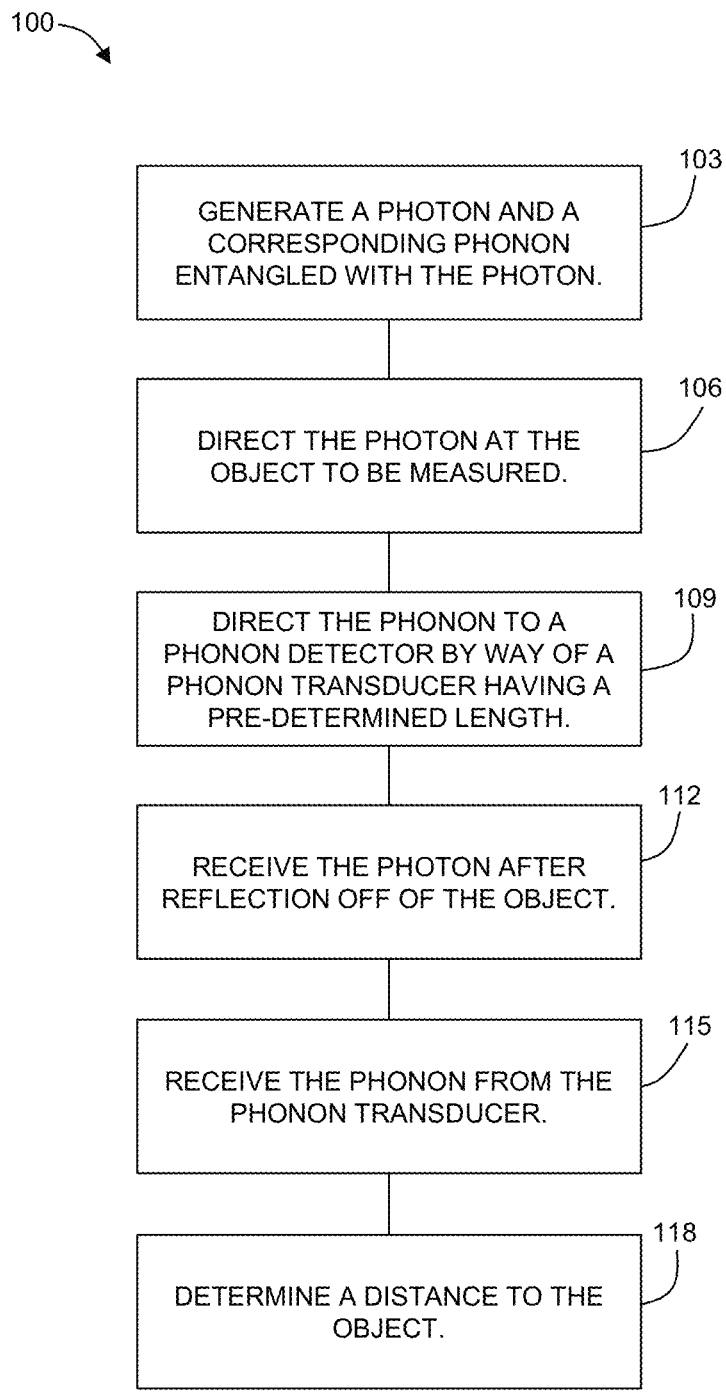
FIG. 6. A chart illustrating a method according to another embodiment of the present disclosure.

In some embodiments, the single-electron emitter 30 and/or the single-hole emitter 26 may utilize a van der Waals material, such as, for example, a transition-metal dichalcogenide (TMD). For example, the single-electron emitter 30 may have a substrate 32 and a TMD heterobilayer 34 disposed on the substrate 32 (see, e.g., FIG. 5). The substrate may be, for example, silicon dioxide $SiO_2$. The heterobilayer may have an n-type TMD 34a coupled with a p-type TMD 34b. The n-type TMD may be, for example, molybdenum disulfide ($MoS_2$). The p-type TMD may be, for example, tungsten diselenide ($WSe_2$). The n-type TMD and the p-type TMD may be coupled via out-of-plane van der Waals interaction.

The heterobilayer 34 is configured as a quantum island for single-charge transport. The single-phonon emitter 30 has a source contact 35 and a drain contact 36. The drain contact may have a bias voltage such that a phonon is emitted with each emitted photon. A gate 37 is configured to selectively control charge transport through the heterobilayer 34.

In some embodiments, the phononic transducer 40 may be a monolayer dielectric having a length which is less than a phonon mean free path. The dielectric may be a semiconductor with weak phonon-phonon coupling, such as, for example, doped graphene, hexagonal-boron nitride (h-BN), etc.

The phonon detector 50 may be configured to convert phononic excitation into an electrical signal. In some embodiments, the phonon detector may include a carrier—for example, graphene, etc.—configured to sense (i.e., as an electrical signal) a drag generated by a flux of a received phonon. In some embodiments, the phonon detector is a TMD single-electron transistor configured to sense a received phonon using phonon-assisted tunneling. Other phonon detectors can be used and are within the scope of the present disclosure.

In another aspect, the present disclosure may be embodied as a system for detecting a distance to a subject. The system includes a phonon-photon pair generator configured to generate an entangled phonon-photon pair. The generator is configured to emit a photon directed to a subject and a corresponding phonon directed to a phonon transducer. The phonon-photon pair generator may be a quantum emitter comprising a monolayer of a van der Waals material (e.g., van der Waals coupled heterobilayer of TMDs as described herein or otherwise). In some embodiments, the system includes a waveguide configured to direct photons emitted by the phonon-photon pair generator.

The system includes a photon detector configured to receive the photon reflected from the subject and a phonon detector configured to receive the corresponding phonon from the phonon-photon pair generator by way of the phonon transducer. The phonon transducer may be a dielectric configured to span a distance between the phonon-photon pair generator and the phonon detector (a dielectric region). In some embodiments, the phonon detector comprises a carrier material layer sensor configured to sense a drag on the carrier material caused by a phonon. The phonon detector may use phonon-assisted tunneling to probe incident phonon flux. A processor is in communication with the phonon detector and the photon detector. The processor is configured to determine a distance to the subject based on an arrival time of the photon and an arrival time of the corresponding phonon.

In another aspect, the present disclosure may be embodied as a method 100 of estimating a distance to an object. The method 100 includes generating 103 a photon and a corresponding phonon entangled with the photon. The photon is directed 106 at the object and the corresponding phonon is directed 109 to a phonon detector by way of a phonon transducer having a pre-determined length. The photon is received 112 after reflection off of the object. The corresponding phonon is received 115 from the phonon transducer. A distance to the subject is determined 118 based on an arrival time of the photon, an arrival time of the corresponding phonon, and/or the pre-determined length of the dielectric region.

Further Discussion

It is well known that hot carriers in semiconductor devices may lose energy efficiently through the emission of optical phonons. In 2D materials, the optical-phonon energies (100-

200 meV) are well above the thermal background at room temperature. As such, devices can be realized in which electron-phonon coupling is exploited to generate single phonons on-demand, to propagate single phonons with low decoherence, and to detect their arrival at a remote location. Such schemes in turn represent a paradigm for quantum-state transduction, in which phonons serve as the carriers of coherent quantum information. In some embodiments, the present disclosure utilizes single phonon sources to provide phonon-based quantum information. Such single phonons may be sourced from electrically-pumped single electrons. In some embodiments, these phonons may be propagated through targeted dielectrics, and their arrival at target devices may be detected. This work builds on our experience of using transient (~ns) electrical measurements to study the details of hot-carrier energy relaxation in 2D materials. In FIGS. 2(a) and 2(b), we present a schematic illustration of the experimental approach. Here, a drive current is used to induce phonon emission from hot carriers in the left conductor, following which they are transmitted through a separate 2D layer (the indicated process of phonon injection) to a second conductor that serves as the phonon detector.

FIG. 2(b) depicts an exemplary application of the present disclosure showing an embodiment for realizing an entangled photon-phonon pair from the decay of a single exciton. Such a pair has an application in a quantum form of LIDAR (LIght Detection And Ranging), in which the different propagation velocities of the phonon and the photon are exploited for on-chip quantum communication. By the time a single photon is reflected back from a remote object, an entangled phonon would still be available on-chip for the quantum measurement. In traditional quantum LIDARs, on the other hand, a pair of entangled photons have been proposed for this purpose. By replacing one of these photons with a phonon, whose sound velocity is several orders of magnitude slower than the speed of light, the issue of storage of a reference quantum particle is resolved. In a situation in which the phonon interacts with a qubit in a semiconductor, a superconductor, or any other suitable material, readout of the qubit can be achieved by exploiting the entanglement of the phonon and the photon.

Single-Phonon Sources and Detectors in 2D Materials

Figure 3:
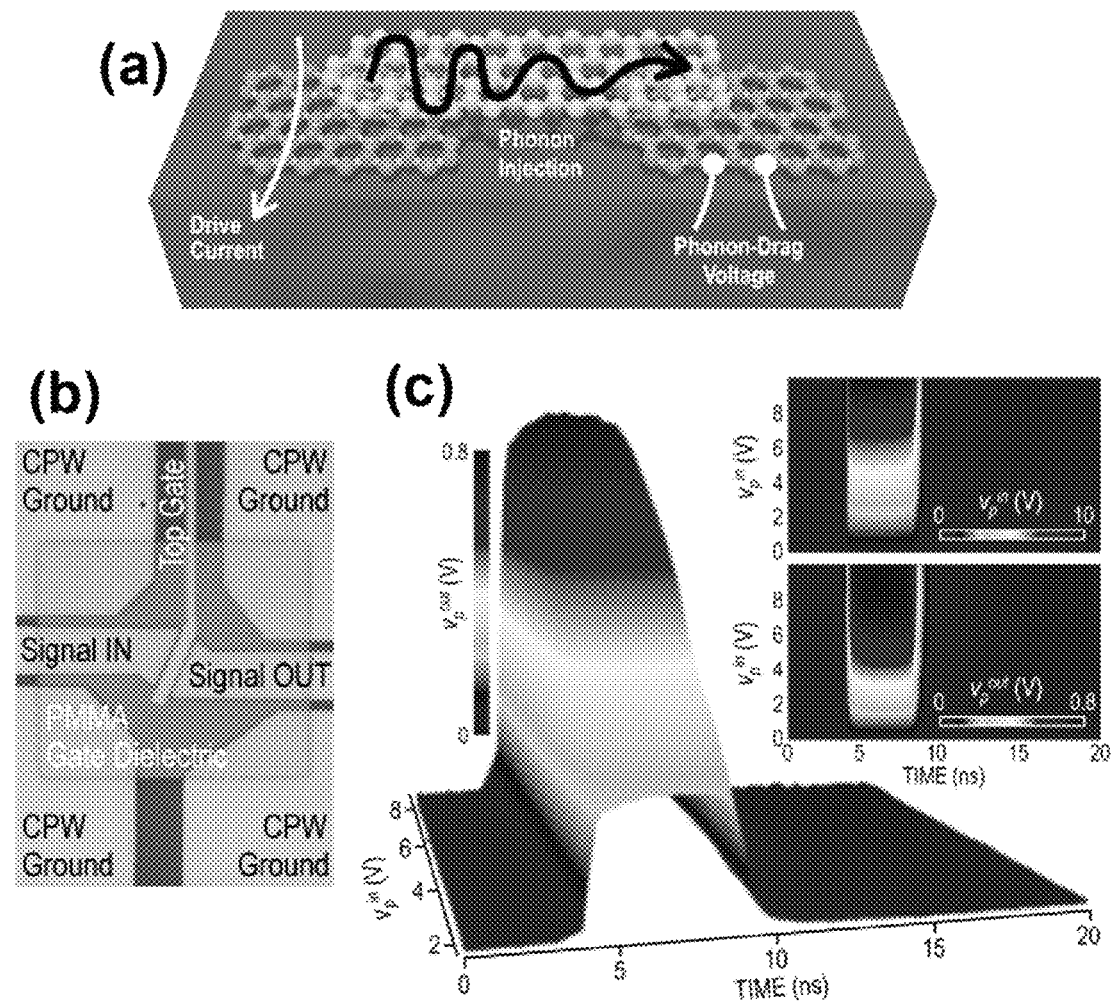
FIG. 3. (a) Schematic illustration of an all-electrical scheme for phonon generation, transmission, and detection. Transition-metal dichalcogenide (TMD)/graphene layers are used for phonon sourcing and detection, while h-BN serves as a phonon transmitter. (b) Top-gated graphene microwave transistor with 50-$\Omega$ CPW structure. Source-drain separation is 1 μm. (c) Color (shading) represents pulsed current in graphene FET and its dependence on input voltage. The insets are contours that compare the shape of input (top) and output pulses.

It is known that hot carriers in semiconductor devices may lose energy efficiently through the emission of optical phonons. In 2D materials, the optical-phonon energies (100-200 meV) are well above the thermal background at room temperature, which provides the opportunity to realize devices in which electron-phonon coupling is exploited to generate single phonons on-demand, to propagate single phonons with low decoherence, and to detect their arrival at a remote location. Such schemes in turn represent a paradigm for quantum-state transduction, in which phonons serve as the carriers of coherent quantum information. Single phonons may be sourced using techniques such as, for example, electrically-pumped single electrons (e.g., exploiting the electron-phonon interaction in single-electron transistors (SETS), etc.) or other techniques. Such phonons may be propagated through targeted dielectrics, and their arrival at target devices may be detected. This work may use transient (~ns) electrical measurements to study the details of hot-carrier energy relaxation in 2D materials. In FIG. 3(a), we show schematically an approach that may be used. Here, a drive current is used to induce phonon emission from hot carriers in the left conductor, following which they are transmitted through a separate 2D layer (the indicated process of phonon injection) to a second conductor that serves as the phonon detector. In initial studies, multi-phonon emission may be used to establish the fundamental elements of this scheme, including the use of phonon drag to electrically detect the transmitted phonons. Single electron sources (such as, for example, the SETS mentioned above) may similarly be used to achieve single-phonon control.

While phonons are usually viewed as a source of decoherence, this is because one is typically concerned with the spontaneous excitation of a large number of modes at finite temperature and/or bias, providing an effective pathway to phase-randomizing scattering. The capacity to source and transmit single phonons, on the other hand, enables the use of these excitations to transduct quantum information between remote locations on a chip. Applications of such a scheme may use the following elements:

Single-phonon sources: May be realized using SETs to pump single electrons on-demand. With the drain bias suitably configured, a series of strongly nonequilibrium electrons may be pumped from the SET, with each such electron spontaneously emitting a single optical phonon.

Phonon transducers: Materials such as graphene and h-BN are suited to serve in this role. Their phonon-phonon coupling is much weaker than in conventional semiconductors, with the dielectric nature of h-BN supporting long mean free paths for phonon propagation. While it is true that strong electron-phonon coupling in graphene allows its phonons to decay in a process that generates electron-hole pairs, this process may be suppressed via the Pauli principle under heavy doping. This has the result of restoring the long phonon mean free path required for efficient phonon propagation.

Single-phonon detectors: These devices convert the phononic excitation of the crystal into a measurable electrical signal, using phenomena such as phonon drag or phonon-assisted single-electron tunneling.

Advantages include ultra-high sensitivity, quantum-coherent operation at increased temperatures that bulk materials (for example, Si and GaAs) require, all-electrical sourcing and detection of single phonons, ability to transduce quantum information between disparate locations on-chip, conveniently implemented in heterostructured form, integrates with existing silicon technology. Applications include, Light Detection And Ranging (LiDAR), sensors, detectors, single-phonon sources and detectors, quantum frequency converters, etc.

As noted earlier, the use of 2D materials enables devices in which strong electron-phonon coupling is exploited to launch phonons, which propagate with low decoherence due to weak anharmonicity. Some embodiments of the present disclosure utilize phonon propagation in h-BN monolayers, and phonon mean free path engineering in backgated graphene.

In some embodiments, dry-transfer techniques may be used to fabricate structures such as that illustrated schematically in FIG. 3(a), in which phonons are excited in h-BN via remote phonon scattering, when electrons in graphene decay to generate phonons in h-BN, and are subsequently detected as they arrive in an appropriate detection layer. In an embodiment, graphene may be utilized for the injection and detection layers and h-BN as the phonon medium. Devices may be fabricated on $SiO_2$ substrates, whose large thermal mismatch with graphene and h-BN will allow the application of rapid pulsing to the graphene source layer, to preferentially inject phonons into the h-BN. The arrival of the phonon flux at the second, sensing, graphene layer may then be monitored, for example, monitored in real time (with sub-nanosecond resolution), by way of the drag generated on the carrier system by the phonons. With this basic embodiment, the characteristics may be determined. For example, temperature dependent investigations (3-500 K) will allow us to determine the factors governing phonon transmission, and to determine how ballistically-injected phonons are scattered as the ambient phonon bath is activated with increasing temperature. This will allow calculations of the coupling of graphene carriers to remote phonons in h-BN, the phonon-phonon decay in supported h-BN, the interfacial thermal conductance between h-BN and the substrate, and phonon transport in the diffusive-to-ballistic crossover regime.

Other phonon detection techniques (other than phonon-drag) may be used. For example, TMD SETs may replace the phonon-drag sensing layer and use phonon-assisted tunneling as a mechanism to probe the incident phonon flux. Photon-assisted tunneling has been widely studied in SETs previously, and is known to lead to photon sidebands in the gate-generated Coulomb oscillations. The sidebands arise since the photon energy is typically much smaller than the charging energy, a situation very different to that anticipated here; since the energy of the transmitted phonons may significantly exceed the charging energy of the SETs, observation of analogous phonon sidebands cannot be expected. By driving the SET into pinch-off, however, the presence of energetic phonons may be detected as a shift in the threshold gate voltage for conduction.

Figure 4:
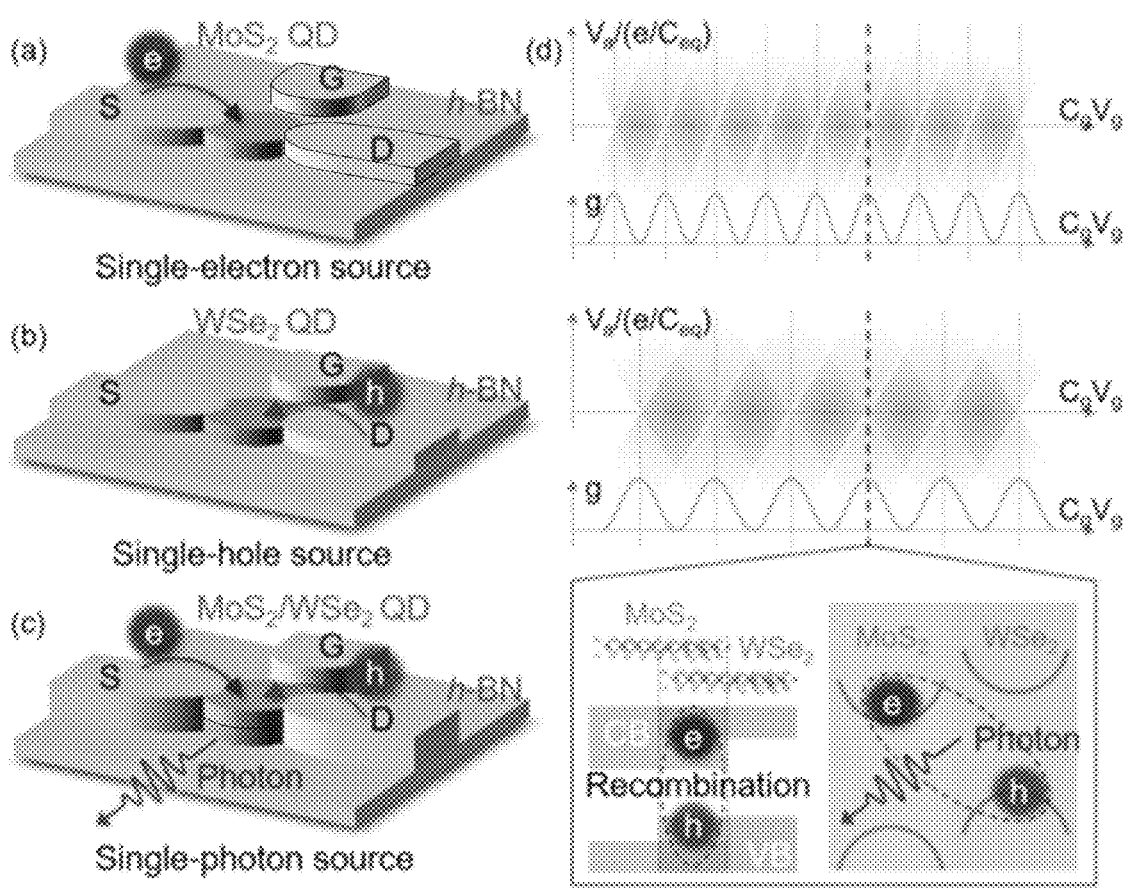
FIG. 4. Schematics of (a) an n-type $MoS_2$-based single-electron transistor (SET), (b) a p-type $WSe_2$-based single-hole transistor (SHT), and a (c) $MoS_2/WSe_2$ 2D heterobilayer single-photon source. (d) Corresponding characteristics including the Coulomb diamonds and linear-conductance oscillations as a function of the drain and gate voltages. The red dash line indicates simultaneous occurrence of single-electron and single-hole injection into the quantum dots. The energy band structure illustrates all-electrical-controlled single-photon emission by the recombination of a single electron and hole in the heterolayer quantum dot.

In an exemplary embodiment of a single-phonon emitter, a single-electron transistor may be coupled with a single-hole transistor via out-of-plane van der Waals (vdW) interaction, in a 2D heterobilayer with common metal contacts and gating architecture (see FIG. 4(c)). While the Coulomb oscillations associated with the two different islands may have different periodicities, through suitable tuning of the back- and side-gate voltages, a simultaneous resonance for electron and hole injection may be achieved (even in the presence of the electrostatic interaction between the dots). This situation is indicated in FIG. 4(d), in which the out-of-plane gate electric field allows tunneling through the vdW gap, followed by rapid (~50 fs) electron-hole recombination. That is, this process provides an all-electrical means for single-photon/single-phonon generation.

In some embodiments, phononics in TMDs may be exploited, in which the phonon energies are lower and the anharmonicity is higher than in graphene and h-BN. Phonons in these materials exhibit chiral nature, which can be used to encode quantum information.

Although the present disclosure has been described with respect to one or more particular embodiments, it will be understood that other embodiments of the present disclosure may be made without departing from the spirit and scope of the present disclosure.

What is claimed is:

1. A quantum sensor, comprising:
   a single-phonon emitter configured to emit a single phonon;
   a phononic transducer configured to receive the emitted single phonon from the single-phonon emitter and propagate the single phonon; and
   a phonon detector configured to detect an arrival of the propagated single phonon received from the phononic transducer.

2. The quantum sensor of claim 1, wherein the single-phonon emitter comprises a single-electron emitter and/or a single-hole emitter configured to emit a single electron and/or a single hole which spontaneously emits a single phonon.

3. The quantum sensor of claim 2, wherein the single-electron emitter and/or single-hole emitter comprises a van der Waals material.

4. The quantum sensor of claim 3, wherein the single-electron emitter comprises:
   a substrate;
   a heterobilayer disposed on the substrate, wherein the heterobilayer comprises an n-type TMD coupled with a p-type TMD, and wherein the heterobilayer is configured as a quantum island for single-charge transport; and
   wherein the heterobilayer is arranged between a source contact and a drain contact, and
   wherein a gate is configured to selectively control charge transport through the heterobilayer.

5. The quantum sensor of claim 4, wherein the n-type TMD is $MoS_2$.

6. The quantum sensor of claim 4, wherein the p-type TMD is $WSe_2$.

7. The quantum sensor of claim 4, wherein the substrate is h-BN.

8. The quantum sensor of claim 4, wherein the n-type TMD and the p-type TMD are coupled via out-of-plane van der Waals interaction.

9. The quantum sensor of claim 4, wherein the drain contact is configured with a bias voltage such that a phonon is emitted with each emitted photon.

10. The quantum sensor of claim 1, wherein the phononic transducer is a monolayer dielectric having a length which is less than a phonon mean free path.

11. The quantum sensor of claim 10, wherein the monolayer dielectric is a semiconductor with weak phonon-phonon coupling.

12. The quantum sensor of claim 1, wherein the phonon detector is configured to convert phononic excitation into an electrical signal.

13. The quantum sensor of claim 12, wherein the phonon detector comprises a carrier configured to sense a drag generated by a flux of a received phonon.

14. The quantum sensor of claim 13, wherein the carrier of the photon detector comprises graphene.

15. The quantum sensor of claim 1, wherein the phonon detector is a TMD single-electron transistor configured to sense a received phonon using phonon-assisted tunneling.

16. A system for detecting a distance to a subject, the system comprising:
    a phonon-photon pair generator configured to emit a photon directed to a subject and a corresponding phonon directed to a phonon transducer, wherein the photon and the phonon are entangled;
    a photon detector configured to receive the photon reflected from the subject;
    a phonon detector configured to receive the corresponding phonon from the phonon-photon pair generator by way of the phonon transducer;
    a processor in communication with the phonon detector and the photon detector, the processor configured to determine a distance to the subject based on an arrival time of the photon and an arrival time of the corresponding phonon.

17. The system of claim 16, wherein the phonon-photon pair generator is a quantum emitter comprising a monolayer of a van der Waals material.

18. The system of claim 16, further comprising a waveguide configured to direct photons emitted by the phonon-photon pair generator.

19. The system of claim 16, wherein the phonon detector comprises a carrier material layer sensor configured to sense a drag on the carrier material caused by a phonon.

20. The system of claim 16, wherein the phonon detector uses phonon-assisted tunneling to probe incident phonon flux.

21. The system of claim 16, wherein the phonon transducer is a dielectric configured to span a distance between the phonon-photon pair generator and the phonon detector.

22. A single-phonon detector, comprising a 2D van der Waals carrier layer configured to sense a drag on the carrier generated by a flux of a phonon.

23. A method of estimating a distance to an object, the method comprising:
- generating a photon and a corresponding phonon entangled with the photon;
- directing the photon at an object;
- directing the corresponding phonon to a phonon detector by way of a phonon transducer having a pre-determined length;
- receiving the photon reflected off of the object;
- receiving the corresponding phonon from the phonon transducer;
- determining a distance to the subject based on an arrival time of the photon, an arrival time of the corresponding phonon, and/or the pre-determined length of the dielectric region.

* * * * *